United States Patent
Sulyman

(10) Patent No.: US 12,237,200 B2
(45) Date of Patent: Feb. 25, 2025

(54) LIFT PIN INTERFACE IN A SUBSTRATE SUPPORT

(71) Applicant: APPLIED MATERIALS, INC., Santa Clara, CA (US)

(72) Inventor: Alexander Sulyman, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 720 days.

(21) Appl. No.: 17/380,233

(22) Filed: Jul. 20, 2021

(65) Prior Publication Data

US 2022/0028720 A1    Jan. 27, 2022

Related U.S. Application Data

(60) Provisional application No. 63/055,148, filed on Jul. 22, 2020.

(51) Int. Cl.
    *H01L 21/683*  (2006.01)
    *H01J 37/32*   (2006.01)
    *H01L 21/687*  (2006.01)

(52) U.S. Cl.
    CPC .... *H01L 21/6833* (2013.01); *H01J 37/32715* (2013.01); *H01L 21/68742* (2013.01); *H01J 2237/2007* (2013.01); *H01J 2237/20235* (2013.01); *H01J 2237/334* (2013.01)

(58) Field of Classification Search
    CPC ......... H01L 21/68742; H01L 21/68785; H01L 21/67103; H01L 21/6831
    See application file for complete search history.

(56) References Cited

U.S. PATENT DOCUMENTS

| | | | | |
|---|---|---|---|---|
| 6,148,762 | A | * | 11/2000 | Fukuda ............. H01L 21/68742 414/935 |
| 2013/0286530 | A1 | | 10/2013 | Lin et al. |
| 2014/0265097 | A1 | | 9/2014 | Cuvalci et al. |
| 2018/0090381 | A1 | | 3/2018 | Sasaki et al. |
| 2019/0080955 | A1 | | 3/2019 | Lee et al. |

(Continued)

FOREIGN PATENT DOCUMENTS

| | | | | |
|---|---|---|---|---|
| CN | 100407398 C | * | 7/2008 | ....... H01L 21/67023 |
| JP | H11233291 A | | 8/1999 | |

(Continued)

OTHER PUBLICATIONS

Elsevier Journal of the European Ceramic Society 36 (2016) 3355-3361; Dielectric properties of pure alumina (Year: 2016).*

(Continued)

*Primary Examiner* — Mahdi H Nejad
(74) *Attorney, Agent, or Firm* — Moser Taboada

(57) ABSTRACT

Methods and apparatus for lift pin interfaces for electrostatic chucks are provided herein. In some embodiments, a lift pin interface in an electrostatic chuck includes: a dielectric plate having a support surface for a substrate; a conductive plate disposed beneath the dielectric plate and having an opening formed therethrough, wherein the dielectric plate includes a protrusion extending into the opening in the conductive plate; and a lift pin guide disposed in the opening, wherein the lift pin guide includes one or more features that extend from an upper surface of the lift pin guide and that overlap with the protrusion of the dielectric plate.

16 Claims, 5 Drawing Sheets

(56) References Cited

U.S. PATENT DOCUMENTS

2019/0131163 A1    5/2019  Kuno et al.
2022/0293451 A1*   9/2022  Sulyman ........... H01L 21/68785

FOREIGN PATENT DOCUMENTS

| JP | 3154629 U | 10/2009 | | |
|---|---|---|---|---|
| JP | 2016063000 A | 4/2016 | | |
| JP | 2016-187056 A | 10/2016 | | |
| JP | 2018101711 A | 6/2018 | | |
| TW | 200406839 A | * | 5/2004 | ............. H01J 37/32 |
| TW | 201344837 A | * | 11/2013 | ............... B23Q 3/15 |

OTHER PUBLICATIONS

Method for Protecting a Bond Layer in a Substrate Support Adapted for Use in a Plasma Processing System; Document ID: CN 101223000 A; Inventor: Ricci, Anthony; Tappan, Jim; Comendant, Keith; Date Published: Jul. 16, 2008; Date Filed: Jul. 13, 2006 (Year: 2008).*
Microfluidic Chip and Micro-fluidic Device; Document ID: CN 112673089 A; Inventor: Yoshitomi, Takumi; Date Published: Apr. 16, 2021; Date Filed: Oct. 16, 2019 (Year: 2021).*
Sample Holder; Document ID: JP 2021086854 A; Date Published: Jun. 3, 2021; Inventor: Takemori Hiromasa; Date Filed: Nov. 25, 2019 (Year: 2021).*
Electrostatic Chuck Device and Manufacturing Method of Electrostatic Chuck Device; Patent No. 2017028049; Document ID: JP 2017028049 A; Date Published: Feb. 2, 2017; Inventor: Ishimura Kazunori; Date Filed: Jul. 21, 2015 (Year: 2017).*
International Search Report for PCT PCT/US2021/042344, dated Nov. 11, 2021.

* cited by examiner

LIFT PIN INTERFACE IN A SUBSTRATE SUPPORT

CROSS-REFERENCE TO RELATED APPLICATIONS

This application claims benefit of U.S. provisional patent application Ser. No. 63/055,148, filed Jul. 22, 2020, which is herein incorporated by reference in its entirety.

FIELD

Embodiments of the present disclosure generally relate to substrate processing systems, and more specifically, to electrostatic chucks for use in substrate processing systems.

BACKGROUND

Electrostatic chucks are used for providing support to substrates within substrate processing systems, such as a plasma processing chamber. For example, an electrostatic chuck may be bonded to a support plate held within the processing volume of a substrate processing chamber. Lift pin holes formed through the electrostatic chuck accommodate lift pins that raise and/or lower substrates onto a support surface of the electrostatic chuck.

In plasma processing chambers, the electrostatic chuck is subjected to high power radio frequency (RF) fields and high-density plasmas in the vicinity of the substrate. The inventor has observed that, in such plasma processing chambers, gas breakdown due to high electric field generation in the lift pin holes can undesirably occur, which can undesirably lead to arcing. The inventor has further observed that the process gas chemistry can also infiltrate the lift pin holes, leading to degradation of bond layers that secure the electrostatic chuck to the support plate.

Accordingly, the inventors have provided embodiments of improved electrostatic chucks.

SUMMARY

Methods and apparatus for lift pin interfaces for electrostatic chucks are provided herein. In some embodiments, a lift pin interface in an electrostatic chuck includes: a dielectric plate having a support surface for a substrate; a conductive plate disposed beneath the dielectric plate and having an opening formed therethrough, wherein the dielectric plate includes a protrusion extending into the opening in the conductive plate; and a lift pin guide disposed in the opening, wherein the lift pin guide includes one or more features that extend from an upper surface of the lift pin guide and that overlap with the protrusion of the dielectric plate.

In some embodiments, a lift pin interface in an electrostatic chuck includes: a dielectric plate having a support surface for a substrate; a conductive plate disposed beneath the dielectric plate and having an opening formed therethrough, wherein the dielectric plate includes a protrusion extending into the opening in the conductive plate; and a lift pin guide disposed in the opening, wherein the lift pin guide includes one or more features that extend from an upper surface of the lift pin guide and that overlap with the protrusion of the dielectric plate, and wherein the lift pin guide includes a passageway to accommodate a lift pin.

In some embodiments, an electrostatic chuck includes: a dielectric plate having a support surface for a substrate; one or more electrodes disposed in the dielectric plate; a conductive plate disposed beneath the dielectric plate and having an opening formed therethrough, wherein the dielectric plate includes a protrusion extending into the opening in the conductive plate; and a lift pin guide disposed in the opening, wherein the lift pin guide includes one or more features that extend from an upper surface of the lift pin guide and that overlap with the protrusion of the dielectric plate, wherein the lift pin guide includes a passageway to accommodate a lift pin, and wherein the dielectric plate and the protrusion include openings aligned with the passageway in the lift pin guide to form a lift pin opening such that a lift pin can move sufficiently to extend beyond the surface of the dielectric plate and to retract beneath the support surface.

In some embodiments, a substrate support including an electrostatic chuck includes: a conductive plate having an opening formed therethrough; a dielectric plate having a support surface for a substrate coupled to the conductive plate, wherein the dielectric plate includes a protrusion extending into the opening in the conductive plate; an elastomer bond layer disposed between the conductive plate and the dielectric plate; one or more electrodes disposed in the dielectric plate and configured to be coupled to a chucking power supply; and a lift pin guide disposed in the opening of the conductive plate, wherein the lift pin guide includes one or more features that extend from an upper surface of the lift pin guide and that overlap with the protrusion of the dielectric plate, wherein the lift pin guide includes a passageway to accommodate a lift pin, and wherein the dielectric plate and the protrusion include openings aligned with the passageway in the lift pin guide to form a lift pin opening such that a lift pin can move sufficiently to extend beyond the surface of the dielectric plate and to retract beneath the support surface.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of lift pin interfaces for use in electrostatic chucks are provided herein. Embodiments of the lift pin interface advantageously provides an increased distance (e.g., creepage length/arc path) from the substrate to conductive portions of the substrate support (e.g., a cooling plate). Embodiments of the lift pin interface advantageously provide the foregoing benefit without reliance on other components, such as o-ring or potting materials for voltage standoff.

Figure 1:
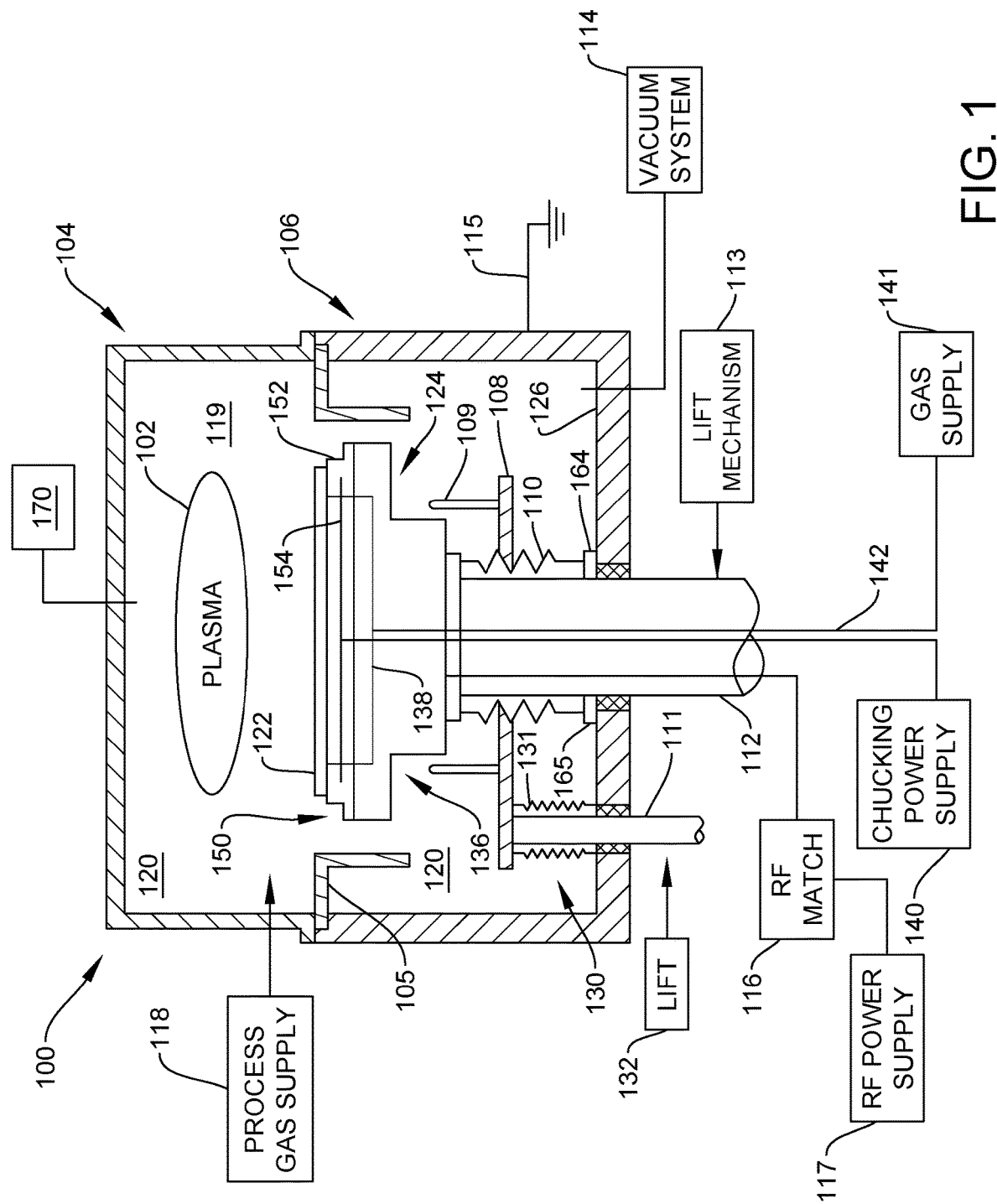
FIG. 1 depicts a schematic side view of a process chamber having an electrostatic chuck in accordance with at least some embodiments of the present disclosure.

FIG. 1 depicts a schematic side view of a process chamber (e.g., a plasma processing chamber) having an electrostatic chuck with a lift pin interface in accordance with at least some embodiments of the present disclosure. In some embodiments, the plasma processing chamber is an etch processing chamber. However, other types of processing chambers configured for different processes can also use or be modified for use with embodiments of the electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be electrostatically retained. The substrate support 124 may generally comprise an electrostatic chuck 150 and a hollow support shaft 112 for supporting the electrostatic chuck 150. The electrostatic chuck 150 comprises a dielectric plate 152 having one or more electrodes 154 disposed therein and a conductive plate 136. The hollow support shaft 112 provides a conduit to provide, for example, backside gases, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a backside gas supply 141, a chucking power supply 140, and RF sources (e.g., RF plasma power supply 170 and RF bias power supply 117) to the electrostatic chuck 150. The backside gas supply 141 is disposed outside of the chamber body 106 and supplies heat transfer gas to the electrostatic chuck 150. In some embodiments, RF plasma power supply 170 and RF bias power supply 117 are coupled to the electrostatic chuck 150 via respective RF match networks (only RF match network 116 shown). In some embodiments, the substrate support 124 may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include through holes to receive the lift pins 109. Details of the configuration and interface of the lift pins 109 are described in greater detail below with respect to FIGS. 2-5.

A bellows assembly 131 is coupled between the substrate lift 130 and bottom surface 126 to provide a flexible seal which maintains the chamber vacuum during vertical motion of the substrate lift 130.

The electrostatic chuck 150 includes gas distribution channels 138 extending from a lower surface of the electrostatic chuck 150 to various openings in an upper surface of the electrostatic chuck 150. The gas distribution channels 138 are in fluid communication with the backside gas supply 141 via gas conduit 142 to control the temperature and/or temperature profile of the electrostatic chuck 150 during use.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power may also be provided from a bias power supply (e.g., RF bias power supply 117) to the one or more electrodes 154 or to some other electrode within the electrostatic chuck 150 to attract ions from the plasma towards the substrate 122. In some embodiments, the bias power supply is coupled to the cooling plate to provide negative bias to a substrate being processed. As RF power is applied to the cooling plate, a voltage difference develops between the cooling plate and the substrate (shown as ΔV in FIGS. 2-5). The voltage difference creates an electric field between the cooling plate and the substrate, which can undesirably cause plasma light-up and arcing.

Figure 2:
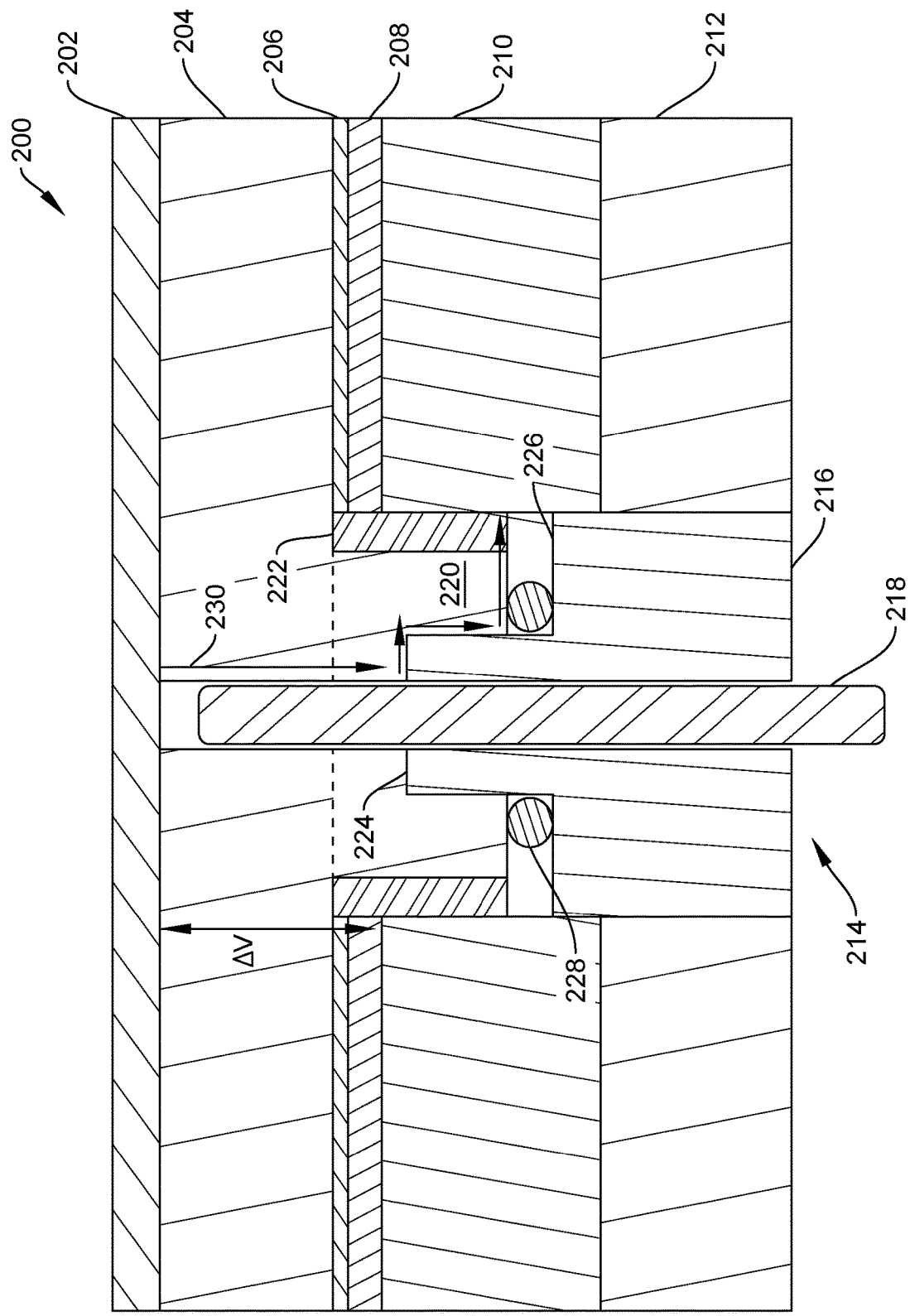
FIG. 2 depicts a schematic side view of a portion of an electrostatic chuck in accordance with at least some embodiments of the present disclosure.

FIG. 2 depicts a schematic side view of a portion of an electrostatic chuck 200 having a lift pin interface in accordance with at least some embodiments of the present disclosure. In some embodiments, the electrostatic chuck 200 is the electrostatic chuck 150 as discussed above with respect to FIG. 1. The electrostatic chuck 200 includes a dielectric plate 204 having an upper support surface for supporting a substrate 202 (such as a semiconductor wafer or the like). The dielectric plate 204 is made of a suitable process compatible ceramic material, such as aluminum nitride (AlN). One or more electrodes are embedded in the dielectric plate 204 and coupled to a chucking power supply (e.g., chucking power supply 140 shown in FIG. 1). The dielectric plate 204 has a lower surface opposite the support surface.

The dielectric plate 204 is coupled to a conductive plate 210. The conductive plate 210 is electrically and thermally conductive. In some embodiments, the conductive plate 210 is made of aluminum (Al). In some embodiments, the conductive plate 210 includes cooling channels configured to flow a coolant therethrough. In some embodiments, the conductive plate 210 is coupled to an RF power supply, such as the RF bias power supply 117 discussed above. The conductive plate 210 sits atop an insulative plate 212 to insulate the conductive plate 210 from ground.

A dielectric or insulative coating 208 can be disposed atop the upper surface of the conductive plate 210. In some embodiments, the insulative coating 208 is aluminum oxide. In some embodiments, the insulative coating 208 is an aluminum oxide spray coating.

An elastomer bond layer 206 can be disposed atop the insulative coating 208. The elastomer bond layer 206 advantageously provides a more robust thermal interface to improve thermal transfer between the dielectric plate 204 and the conductive plate 210. The elastomer bond layer 206 further advantageously bonds the dielectric plate 204 to the conductive plate 210. The elastomer bond layer 206 can be any process compatible compliant thermally conductive material, such as silicone or silicone-based materials.

An opening 214 is formed through the conductive plate 210 and the insulative plate 212 to receive a lift pin guide 216. The lift pin guide 216 fits within the opening 214 and includes a passageway to accommodate a lift pin 218. The lift pin guide 216 can be made of a process-compatibly insulative material, such as polytetrafluoroethylene (e.g., TEFLON®), a ceramic, or combinations thereof. The lift pin guide can be made of a singular piece of material or have multiple parts (e.g., made of multiple parts each made of the same or a different material).

The dielectric plate 204 includes a protrusion 220 configured to extend into the opening 214 when the dielectric plate 204 is disposed on the conductive plate 210. In some embodiments, the protrusion 220 and the dielectric plate 204 are unitarily formed (e.g., monolithic). In some embodiments, the protrusion 220 is coupled to the dielectric plate 204, for example by bonding using an insulative bonding technique, such as diffusion bonding (as indicated by dashed lines).

The dielectric plate 204 and the protrusion 220 include an opening aligned with the passageway in the lift pin guide 216, when inserted in the opening 214, to form a lift pin opening such that a lift pin 218 can move sufficiently to extend beyond the surface of the dielectric plate 204 (for example, to hold a substrate above the support surface of the dielectric plate 204) and to retract beneath the support surface (for example, to place a substrate on the support surface of the dielectric plate 204). The lift pin 218 lift pin can be fabricated of any process-compatible insulative material that will not damage or contaminate the substrate 202, for example aluminum oxide.

The upper portion of the lift pin guide 216 includes one or more features that interface with the protrusion 220 of the dielectric plate 204 to advantageously provide a lift pin interface having an increased distance (e.g., creepage length/arc path) from the backside of the substrate 202 to the conductive plate 210. The one or more features overlap with the protrusion 220 to increase the length of the lift pin interface. The lift pin interface further advantageously prevents a line of sight from the top of the dielectric plate 204 (and backside of the substrate 202) to the elastomer bond layer 206 and, in some embodiments, to an o-ring 228 disposed between the lift pin guide 216 and the protrusion 220, thus, advantageously reducing or eliminating process chemistry impact on the elastomer bond layer 206.

For example, in some embodiments, the lift pin interface includes one or more shoulders extending upward from the lift pin guide. As depicted in FIG. 2, in some embodiments, the lift pin guide 216 includes one shoulder 224 extending upward from an upper surface 226 of the lift pin guide 216. The shoulder 224 can be an inner shoulder disposed around the lift pin passageway. Optionally, o-ring 228 can be disposed on the upper surface 226 around the sidewalls of the shoulder 224. The o-ring can be made of any standard process-compatible material such as silicone or a perfluoroelastomer material. The protrusion 220 in the dielectric plate 204 can include a countersink that mates with the shoulder 224. As shown in FIG. 2, a lengthy, torturous path between the backside of the substrate 202 and the conductive plate 210 is formed by the lift pin interface along the opening in the dielectric plate 204, the upper surface and sidewalls of the shoulder 224, and along the protrusion 220 (as shown by arrows 230).

Figure 3:
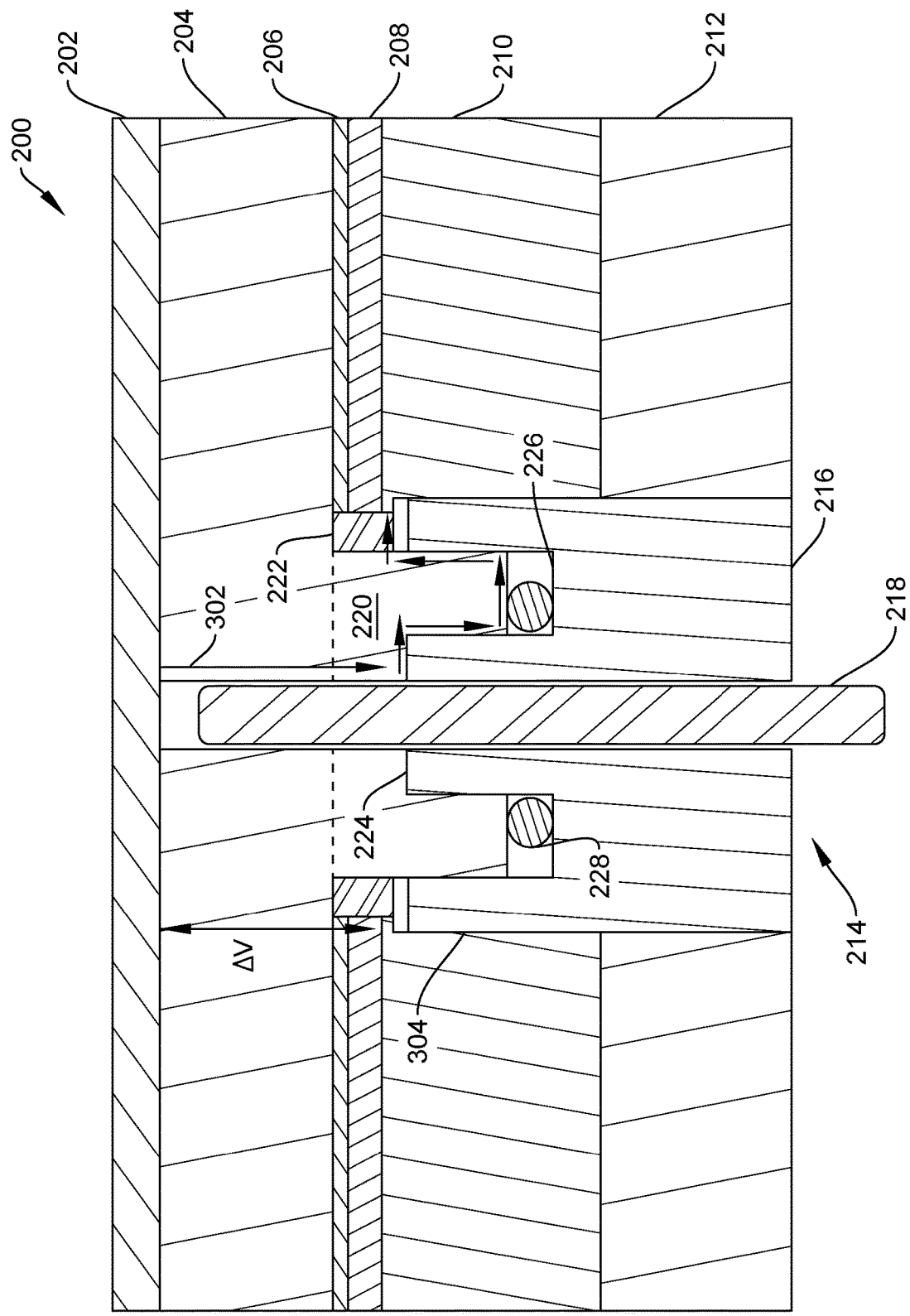
FIG. 3 depicts a schematic side view of a portion of an electrostatic chuck in accordance with at least some embodiments of the present disclosure.

In some embodiments, and as shown in FIG. 3, the lift pin guide 216 includes two shoulders (shoulder 224 and shoulder 304) extending upward from the upper surface 226 of the lift pin guide 216. The shoulder 224 can be an inner shoulder disposed around the lift pin passageway. The shoulder 304 can be an outer shoulder, for example disposed proximate an outer periphery of the lift pin guide 216. The two shoulders 224, 304 can have the same or different dimensions. For example, the shoulders can have the same height or different heights. Alternatively or in combination, the shoulders can have the same width or different widths. Optionally, o-ring 228 can be disposed on the upper surface 226 between the sidewalls of the shoulder 224 and the shoulder 304. The protrusion 220 in the dielectric plate 204 can include a countersink that mates with the shoulder 224. The outer diameter of the protrusion 220 is smaller than the inner diameter of the shoulder 304 such that at least a portion of the protrusion 220 can fit between the shoulders 224, 304. As shown in FIG. 3, a lengthy, torturous path between the backside of the substrate 202 and the conductive plate 210 is formed by the lift pin interface along the opening in the dielectric plate 204, the upper surface and sidewalls of the shoulder 224, along the protrusion 220, and the inner sidewalls and upper surface of the shoulder 304 (as shown by arrows 302).

Figure 4:
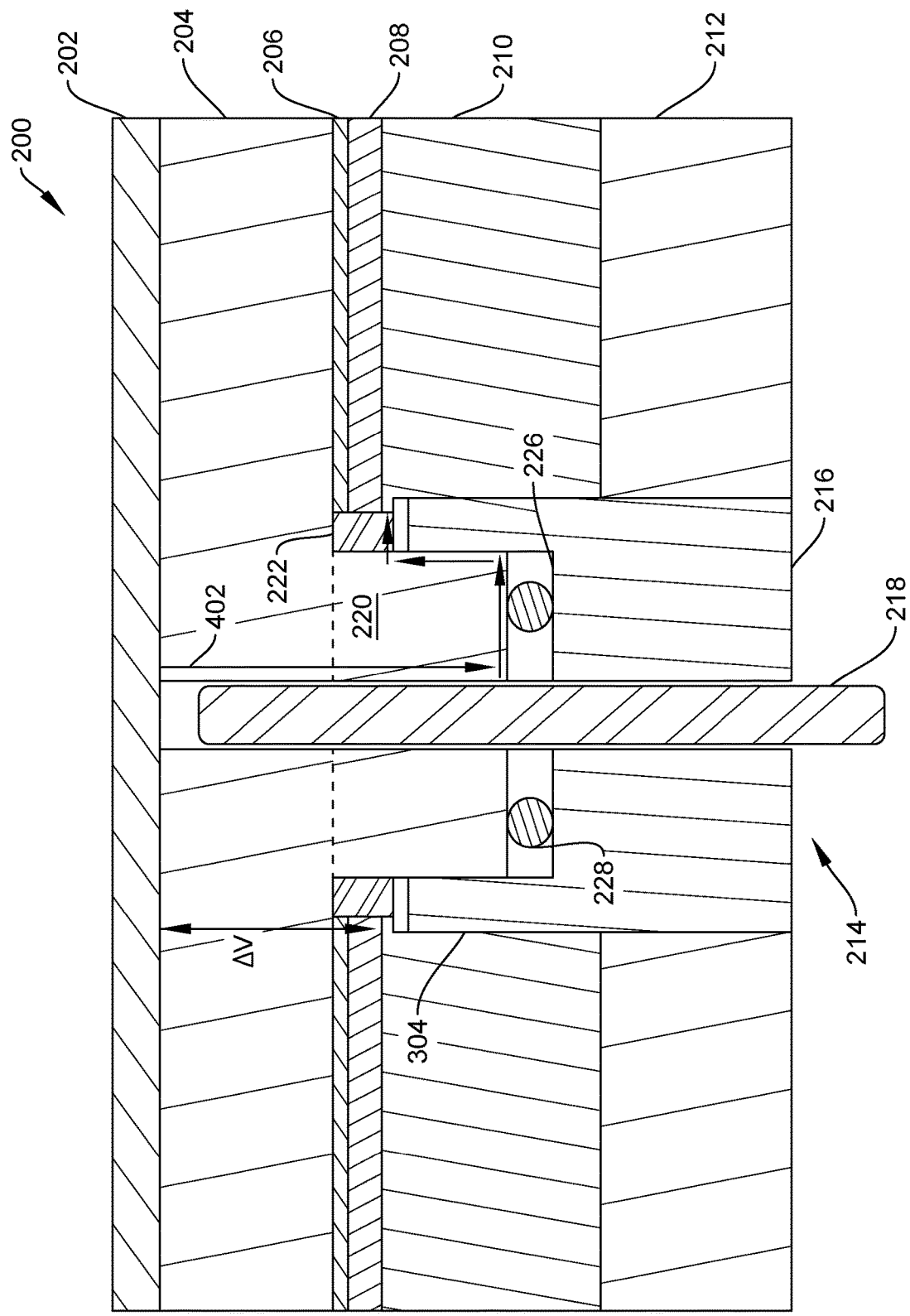
FIG. 4 depicts a schematic side view of a portion of an electrostatic chuck in accordance with at least some embodiments of the present disclosure.

In some embodiments, and as shown in FIG. 4, the lift pin guide 216 includes one shoulder 304 extending upward from the upper surface 226 of the lift pin guide 216. The shoulder 304 can be an outer shoulder, for example disposed proximate an outer periphery of the lift pin guide 216. Optionally, o-ring 228 can be disposed on the upper surface 226 radially within the sidewalls of the shoulder 304. The outer diameter of the protrusion 220 is smaller than the inner diameter of the shoulder 304 such that at least a portion of the protrusion 220 can fit within the interior space defined by the shoulder 304. As shown in FIG. 4, a lengthy, torturous path between the backside of the substrate 202 and the conductive plate 210 is formed by the lift pin interface along the opening in the dielectric plate 204, along the protrusion 220, and the inner sidewalls and upper surface of the shoulder 304 (as shown by arrows 402).

Figure 5:
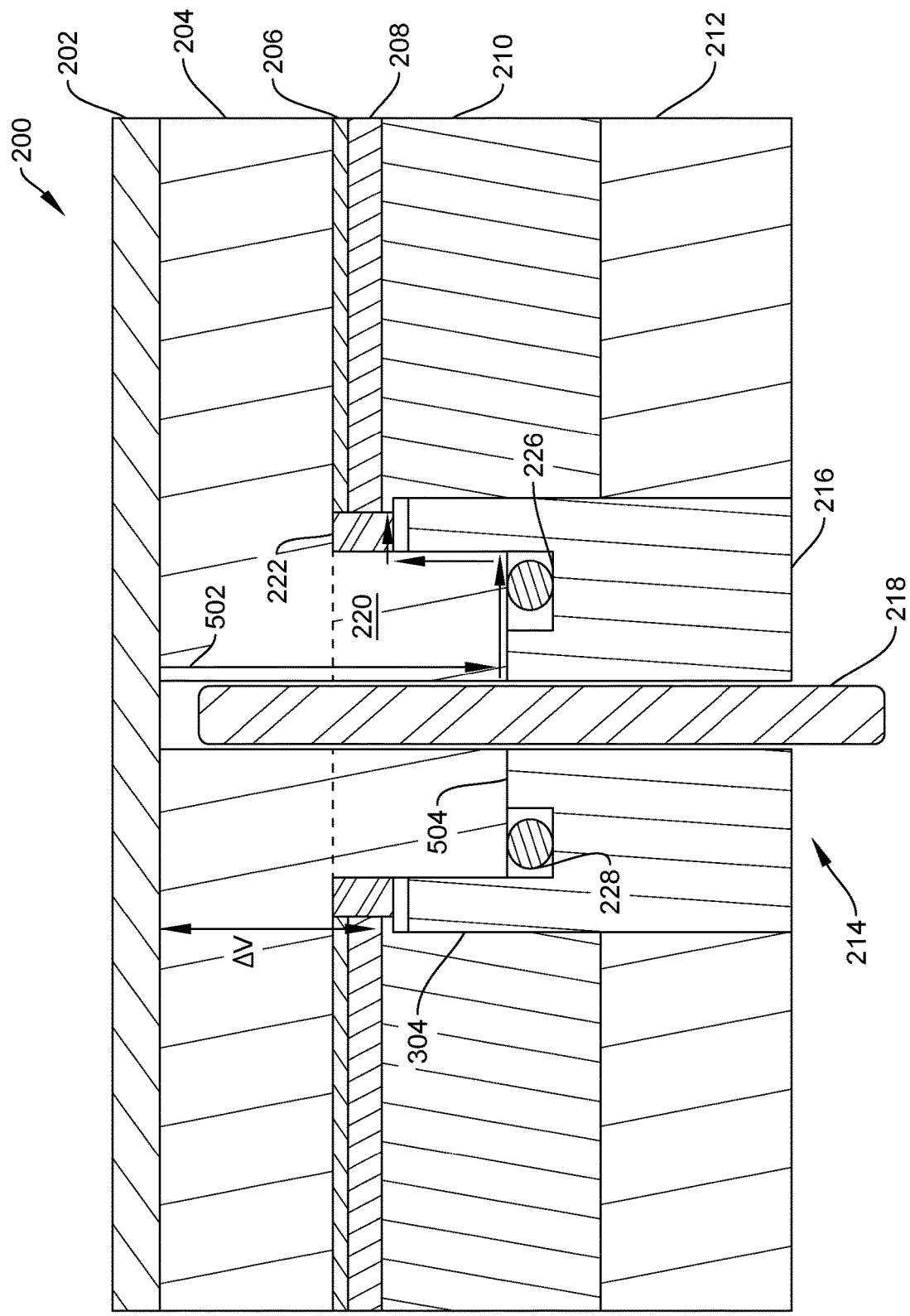
FIG. 5 depicts a schematic side view of a portion of an electrostatic chuck in accordance with at least some embodiments of the present disclosure.

In some embodiments, and as shown in FIG. 5, the lift pin guide 216 includes two shoulders (shoulder 304 and shoulder 504) extending upward from the upper surface 226 of the lift pin guide 216. The shoulder 304 can be an outer shoulder, for example disposed proximate an outer periphery of the lift pin guide 216. The shoulder 504 can be an inner shoulder disposed around the lift pin passageway. As depicted in FIG. 5, the inner shoulder 504 may have a height such that the protrusion 220 in the dielectric plate 204 does not need a countersink to mate with the shoulder 504. The shoulders 304, 504 can have the same width or different widths. Optionally, o-ring 228 can be disposed on the upper surface 226 between the sidewalls of the shoulder 304 and the shoulder 504. The outer diameter of the protrusion 220 is smaller than the inner diameter of the shoulder 304 such that at least a portion of the protrusion 220 can fit within the interior space defined by shoulder 304. As shown in FIG. 5, a lengthy, torturous path between the backside of the substrate 202 and the conductive plate 210 is formed by the lift pin interface along the opening in the dielectric plate 204, along the protrusion 220, and up the inner sidewalls and upper surface of the shoulder 304 (as shown by arrows 502).

Although not clearly shown in FIGS. 2-5, a small gap exists between adjacent components along the torturous path shown by arrows 230, 302, and 402 to facilitate fabrication tolerances, differences in thermal expansion, and the like.

In each of the embodiments disclosed herein, the protrusion 220 increases the distance from the o-ring to the backside of the substrate 202, thus moving the o-ring to an area having a lower voltage differential and having a line of sight blocked by the lift pin guide 216 advantageously reducing the erosion rate of the o-ring 228. Moreover, in each of the embodiments disclosed herein, the o-ring is advantageously easily replaceable.

In some embodiments, an optional compliant gap-filling material 222 can be disposed between the outer periphery of the protrusion 220 and the surrounding portion of the opening 214. The compliant gap-filling material 222 can be any process-compatible compliant gap-filling material used in substrate processing, such potting materials, for example silicone or silicone-based potting materials. In some embodiments, the compliant gap-filling material 222 and the elastomer bond layer 206 may be the same material. Alternatively, the compliant gap-filling material 222 can be omitted and an air gap can exist between the outer periphery of the protrusion 220 and the surrounding portion of the opening 214.

Thus, embodiments of improved lift pin interfaces for electrostatic chucks have been provided herein. Embodiments of the present disclosure advantageously reduce or eliminate surface arcing and protect bond materials of the electrostatic chuck. Embodiments of the improved lift pin interface further advantageously moves the interface from high electric field areas to lower electric field areas to reduce or eliminate plasma ignition in that area.

While the foregoing is directed to embodiments of the present disclosure, other and further embodiments of the disclosure may be devised without departing from the basic scope thereof.

The invention claimed is:

1. A lift pin interface in an electrostatic chuck, comprising:
   a dielectric plate having a support surface for a substrate;
   a conductive plate disposed beneath the dielectric plate and having an opening formed therethrough,
   wherein the dielectric plate includes a protrusion extending into the opening in the conductive plate; and
   a lift pin guide disposed in the opening, wherein the lift pin guide includes one or more features that extend from an upper surface of the lift pin guide and that overlap with the protrusion of the dielectric plate, wherein the one or more features include at least one shoulder,
   wherein the protrusion in the dielectric plate includes a countersink that mates with a shoulder of the at least one shoulder, and wherein the lift pin guide includes a passageway to accommodate a lift pin.

2. The lift pin interface of claim 1, wherein the one or more features include a single inner shoulder disposed around the passageway.

3. The lift pin interface of claim 1, further comprising:
   an o-ring disposed on the upper surface of the lift pin guide between the lift pin guide and the protrusion.

4. The lift pin interface of claim 1, wherein the one or more features include two shoulders, and wherein the protrusion extends between the two shoulders.

5. The lift pin interface of claim 4, further comprising:
   an o-ring disposed on the upper surface of the lift pin guide between the two shoulders.

6. The lift pin interface of claim 4, wherein the two shoulders include an inner shoulder disposed around the passageway and an outer shoulder, wherein the countersink mates with the inner shoulder, and wherein the outer shoulder surrounds the protrusion.

7. The lift pin interface of claim 4, wherein the two shoulders have the same length.

8. The lift pin interface of claim 4, wherein the two shoulders have different lengths.

9. The lift pin interface of claim 1, further comprising an insulative coating disposed atop an upper surface of the conductive plate.

10. The lift pin interface of claim 9, further comprising an elastomer bond layer disposed atop the insulative coating.

11. The lift pin interface of claim 1, further comprising a compliant, gap-filling material disposed between an outer periphery of the protrusion and a surrounding portion of the opening.

12. An electrostatic chuck, comprising:
   a dielectric plate having a support surface for a substrate;
   one or more electrodes disposed in the dielectric plate;
   a conductive plate disposed beneath the dielectric plate and having an opening formed therethrough,
   wherein the dielectric plate includes a protrusion extending into the opening in the conductive plate; and
   a lift pin guide disposed in the opening, wherein the lift pin guide includes one or more features that extend from an upper surface of the lift pin guide and that overlap with the protrusion of the dielectric plate, wherein the lift pin guide includes a passageway to accommodate a lift pin, wherein the one or more features include either a single inner shoulder disposed around the passageway or a single outer shoulder that surrounds the protrusion, wherein the protrusion in the dielectric plate includes a countersink that mates with the single inner shoulder or the single outer shoulder, and wherein the dielectric plate and the protrusion include openings aligned with the passageway in the lift pin guide to form a lift pin opening such that the lift pin can move sufficiently to extend beyond the support surface of the dielectric plate and to retract beneath the support surface.

13. The electrostatic chuck of claim 12, further comprising:
- an insulative coating disposed atop an upper surface of the conductive plate; and
- an elastomer bond layer disposed atop the insulative coating.

14. A substrate support including an electrostatic chuck, comprising:
- a conductive plate having an opening formed therethrough;
- a dielectric plate having a support surface for a substrate coupled to the conductive plate, wherein the dielectric plate includes a protrusion extending into the opening in the conductive plate;
- an elastomer bond layer disposed between the conductive plate and the dielectric plate;
- one or more electrodes disposed in the dielectric plate and configured to be coupled to a chucking power supply; and
- a lift pin guide disposed in the opening of the conductive plate, wherein the lift pin guide includes one or more features that extend from an upper surface of the lift pin guide and that overlap with the protrusion of the dielectric plate, wherein the one or more features include a shoulder,
- wherein the protrusion in the dielectric plate includes a countersink that mates with the shoulder, and
- wherein the lift pin guide includes a passageway to accommodate a lift pin.

15. The substrate support of claim 14, further comprising:
- a chucking power supply coupled to the one or more electrodes;
- an RF power supply coupled to the conductive plate; and
- an insulative plate disposed beneath the conductive plate to insulate the conductive plate from ground.

16. A lift pin interface in an electrostatic chuck, comprising:
- a dielectric plate having a support surface for a substrate;
- a conductive plate disposed beneath the dielectric plate and having an opening formed therethrough,
- wherein the dielectric plate includes a protrusion extending into the opening in the conductive plate; and
- a lift pin guide disposed in the opening, wherein the lift pin guide includes one or more features that extend from an upper surface of the lift pin guide and that overlap with the protrusion of the dielectric plate, wherein the one or more features include either a single inner shoulder disposed around the passageway or a single outer shoulder that surrounds the protrusion, wherein the protrusion in the dielectric plate includes a countersink that mates with the single inner shoulder or the single outer shoulder, and wherein the lift pin guide includes a passageway to accommodate a lift pin.

* * * * *